US012744171B2

(12) United States Patent
Cheng et al.

(10) Patent No.: US 12,744,171 B2
(45) Date of Patent: Sep. 22, 2026

(54) ELECTRONIC DEVICE

(71) Applicant: ASUSTek COMPUTER INC., Taipei City (TW)

(72) Inventors: Wei-Ting Cheng, Taipei City (TW); Ching-Yuan Yang, Taipei City (TW)

(73) Assignee: ASUSTeK COMPUTER INC., Taipei City (TW)

( * ) Notice: Subject to any disclaimer, the term of this patent is extended or adjusted under 35 U.S.C. 154(b) by 97 days.

(21) Appl. No.: 18/797,537

(22) Filed: Aug. 8, 2024

(65) Prior Publication Data

US 2025/0095932 A1 Mar. 20, 2025

(30) Foreign Application Priority Data

Sep. 19, 2023 (TW) ................................ 112135616

(51) Int. Cl.
*H05K 5/00* (2025.01)
*A63F 13/24* (2014.01)
*H01H 21/22* (2006.01)

(52) U.S. Cl.
CPC ............. *H01H 21/22* (2013.01); *A63F 13/24* (2014.09); *H05K 5/0017* (2013.01)

(58) Field of Classification Search
CPC ...... H05K 5/0017; H01H 21/22; A63F 13/24; G06F 1/16
See application file for complete search history.

(56) References Cited

U.S. PATENT DOCUMENTS

| | | | | |
|---|---|---|---|---|
| 9,001,500 | B2 * | 4/2015 | Chen | G06F 1/1624 361/679.01 |
| 9,431,190 | B2 * | 8/2016 | McClure | G06F 1/1635 |
| 9,823,702 | B2 * | 11/2017 | Zhang | G06F 1/1656 |
| 9,824,831 | B2 | 11/2017 | Liu et al. | |
| 10,317,953 | B2 * | 6/2019 | Esmaeili | G06F 1/1626 |
| 10,349,544 | B2 * | 7/2019 | Katsuyama | G06F 1/1616 |
| 10,452,107 | B2 * | 10/2019 | Katsuyama | G06F 1/1632 |
| 11,016,527 | B2 * | 5/2021 | Park | H04M 1/0218 |
| 11,079,812 | B1 * | 8/2021 | Bushnell | G06F 1/1626 |

(Continued)

FOREIGN PATENT DOCUMENTS

| | | |
|---|---|---|
| CN | 112071687 | 12/2020 |
| CN | 217822488 | 11/2022 |

(Continued)

*Primary Examiner* — Imani N Hayman
*Assistant Examiner* — Rashen E Morrison
(74) *Attorney, Agent, or Firm* — JCIPRNET

(57) ABSTRACT

An electronic device includes a casing, an exterior button, a sliding assembly and an internal button. The casing includes an outer surface and an opening at the outer surface. The exterior button has a first side and a second side opposite to each other, the first side is pivotally connected to the casing so that the exterior button is rotatably disposed at the casing. The sliding assembly is movably disposed on the casing, and includes a sliding body, a toggle and a pusher, the sliding body is located in the casing, the toggle is fixed to the sliding body and exposed to the casing, and the pusher is linked with the sliding body in a first direction, and is movably disposed at the sliding body in a second direction. The inner button is located in the casing, and the sliding assembly is located between the outer button and the inner button.

12 Claims, 6 Drawing Sheets

(56) References Cited

U.S. PATENT DOCUMENTS

| | | | | |
|---|---|---|---|---|
| 12,236,027 | B2 * | 2/2025 | Lu | G06F 3/03545 |
| 2003/0094354 | A1 * | 5/2003 | Badarneh | G06F 3/0362 200/18 |
| 2012/0120566 | A1 * | 5/2012 | Miao | H04M 1/0249 361/679.01 |
| 2013/0155584 | A1 * | 6/2013 | Chen | G06F 1/1624 361/679.01 |
| 2015/0294808 | A1 * | 10/2015 | Liu | H01H 3/12 200/344 |
| 2020/0272256 | A1 * | 8/2020 | Hsu | G06F 3/0442 |
| 2023/0187971 | A1 * | 6/2023 | An | G06F 3/038 320/108 |
| 2023/0224393 | A1 * | 7/2023 | Froese | H04M 1/035 455/575.8 |
| 2025/0240363 | A1 * | 7/2025 | Baker | H04M 1/0268 |

FOREIGN PATENT DOCUMENTS

| | | | |
|---|---|---|---|
| TW | I511173 | 12/2015 | |
| TW | M545280 | 7/2017 | |
| TW | M643872 | 7/2023 | |
| TW | M643872 U * | 7/2023 | H01H 15/22 |

* cited by examiner

ELECTRONIC DEVICE

CROSS-REFERENCE TO RELATED APPLICATION

This application claims the priority benefit of Taiwan application serial no. 112135616, filed on Sep. 19, 2023. The entirety of the above-mentioned patent application is hereby incorporated by reference herein and made a part of this specification.

BACKGROUND

Technical Field

The application relates to an electronic device with buttons that can protrude or retract.

Description of Related Art

With the development of the mobile gaming and e-sports industries and the rise in users' entertainment needs, e-sports mobile phones have gradually become popular in the consumer market. At present, virtual buttons on the screen are mainly used. However, the virtual buttons provide a low sense of game feedback and cannot provide a high-quality user experience.

SUMMARY

The electronic device of the application includes a casing, an exterior button, a sliding assembly and an internal button. The casing includes an outer surface and an opening at the outer surface. The exterior button has a first side and a second side opposite to each other, the first side is pivotally connected to the casing so that the exterior button is rotatably disposed at the casing. The sliding assembly is movably disposed on the casing, and includes a sliding body, a toggle and a pusher, the sliding body is located in the casing, the toggle is fixed to the sliding body and exposed to the casing, and the pusher is linked with the sliding body in a first direction, and is movably disposed at the sliding body in a second direction. The inner button is located in the casing, and the sliding assembly is located between the outer button and the inner button. When the sliding assembly is in a closed position relative to the casing, the second side of the exterior button is retracted within the casing. When the sliding assembly moves from the closed position to an open position along the first direction relative to the casing, the second side of the exterior button protrudes from the opening and protrudes beyond the outer surface, and the exterior button is adapted to be pressed, driving the pusher to move along the second direction to trigger the internal button.

Based on the above, the first side of the exterior button of the electronic device of the application is pivotally connected to the casing, so that the exterior button is rotatably disposed on the casing. The sliding assembly is located between the exterior button and the internal button. The toggle of the sliding assembly is fixed to the sliding body and exposed to the casing. The pusher is linked to the sliding body in the first direction, and is movably arranged on the sliding body in the second direction. When the sliding assembly is in the closed position relative to the casing, the second side of the exterior button is retracted within the casing. When the sliding assembly moves along the first direction relative to the casing from the closed position to the open position, the second side of the exterior button protrudes from the opening and protrudes beyond the outer surface. The exterior button is suitable for being pressed to drive the pusher to move along the second direction to trigger the internal button, thereby allowing the user to press the physical exterior button to trigger the internal button, and providing a better gaming experience feedback.

DESCRIPTION OF THE EMBODIMENTS

Figure 1:
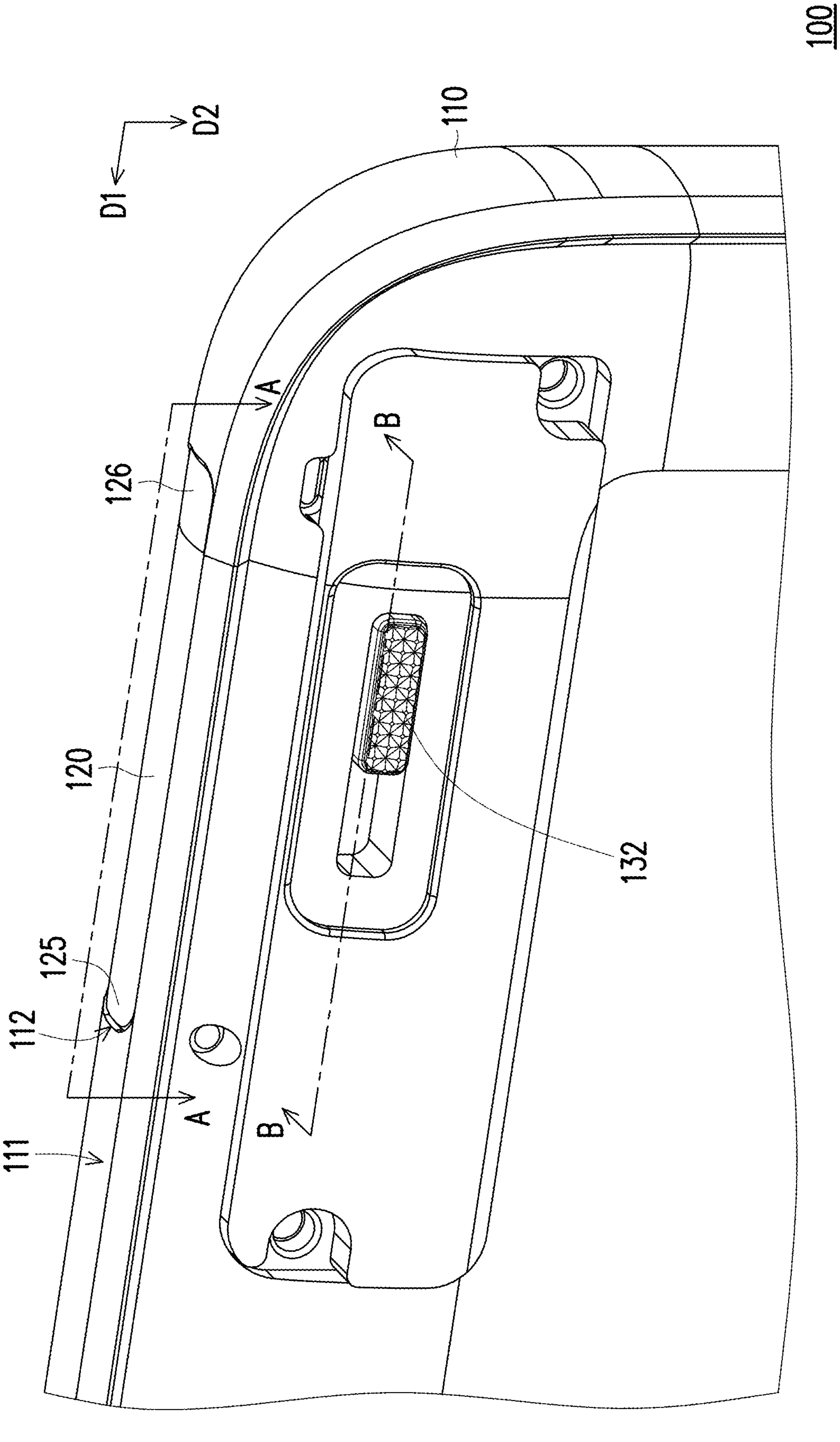
FIG. 1 is a partial appearance diagram of an electronic device according to an embodiment of the present invention.
Figure 2A:
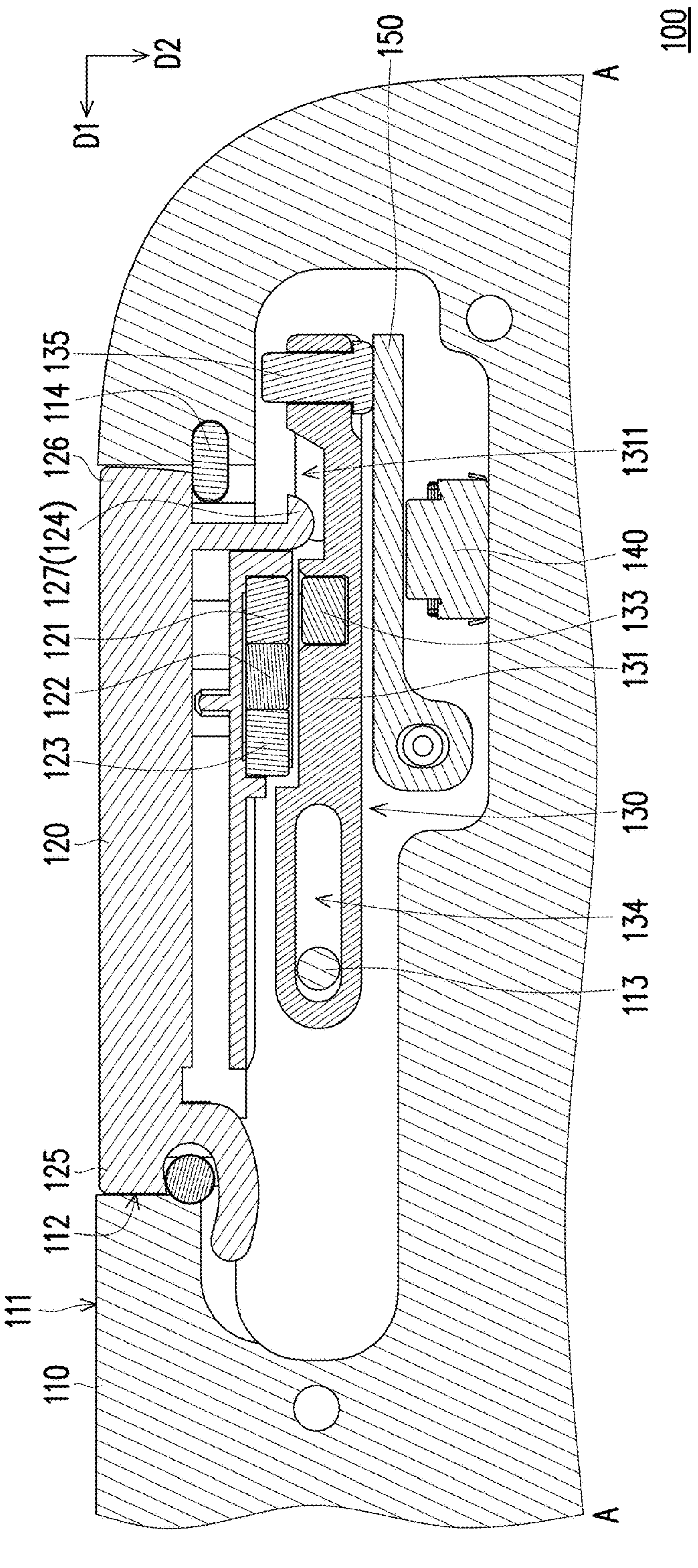
FIG. 2A is a cross-sectional view of the electronic device of FIG. 1 along line segment A-A.

FIG. 1 is a partial appearance diagram of an electronic device according to an embodiment of the present invention. FIG. 2A is a cross-sectional view of the electronic device of FIG. 1 along line segment A-A. It should be noted that the electronic device 100 in FIG. 1 takes a mobile phone as an example, and the viewing angle is shown in the direction facing the back cover of the mobile phone.

Referring to FIG. 1 and FIG. 2A, the electronic device 100 of the embodiment is, for example, a mobile phone, but the type of the electronic device 100 is not limited thereto. The electronic device 100 includes a casing 110, an exterior button 120, a sliding assembly 130 (FIG. 2A), and an internal button 140 (FIG. 2A). The casing 110 includes an outer surface 111 and an opening 112 at the outer surface 111.

The exterior button 120 is, for example, a shoulder button, but it is not limited thereto. The exterior button 120 has a first side 125 and a second side 126 opposite to each other. As shown in FIG. 2A, in the embodiment, the first side 125 is pivotally connected to the casing 110 so that the exterior button 120 is rotatably disposed at the casing 110. That is to say, in one state, the second side 126 of the exterior button 120 can protrude from the outer surface 111 for the user to press down, thereby providing a physical pressing feeling.

Figure 2B:
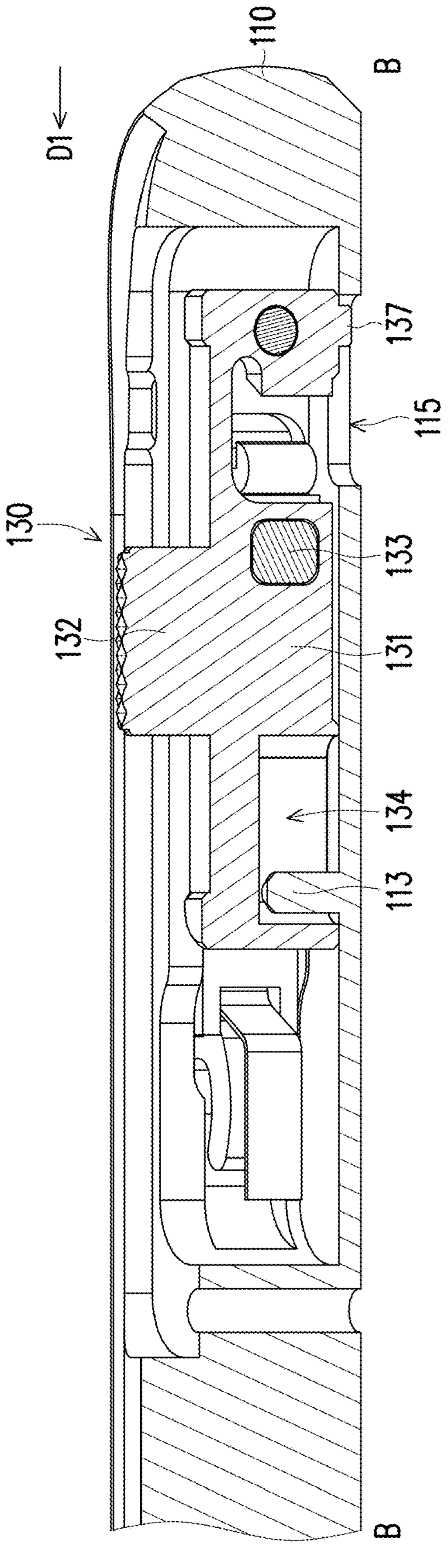
FIG. 2B is a cross-sectional view of the electronic device of FIG. 1 along line segment B-B.

As shown in FIG. 2A, the sliding assembly 130 is movably disposed on the casing 110, and includes a sliding body 131, a toggle 132, and a pusher 135. The sliding body 131 is located in the casing 110. FIG. 2B is a cross-sectional view of the electronic device of FIG. 1 along line segment B-B. Referring to FIG. 2B, the toggle 132 is fixed to the sliding body 131 and exposed to the casing 110. The toggle 132 can be disposed close to the edge of the back cover (the casing 110) of the mobile phone (the electronic device 100) to facilitate user operation, but the position of the toggle 132 is not limited thereto.

One of the casing 110 and the sliding body 131 includes a first track 134 extending along a first direction D1, and the other includes a first guide pillar 113 extending into the first track 134. Such a design ensures the movement direction of the sliding assembly 130 and guides the user to only move the toggle 132 along the first direction D1, thereby helping the user to move the toggle 132 intuitively without thinking.

In addition, the casing 110 or the sliding body 131 having the first track 134 further includes a second guide pillar 137, and the other includes a second track 115 along the first direction D1, the second guide pillar 137 extends into the second track 115 to provide double guarantee of stable sliding trajectory. In the embodiment, the sliding body 131 includes the first track 134 and the second guide pillar 137, and the casing 110 includes the first guide pillar 113 and the second track 115, but it is not limited thereto.

Returning to FIG. 2A, in the embodiment, the pusher 135 is linked to the sliding body

131 in the first direction D1, and is movably disposed on the sliding body 131 in a second direction D2. The first direction D1 is, for example, parallel to the extension direction of the outer surface 111, and the first direction D1 is perpendicular to the second direction D2, but it is not limited to thereto.

The internal button 140 is located in the casing 110, and the sliding assembly 130 is located between the exterior button 120 and the internal button 140. The exterior button 120 can trigger the internal button 140 through the sliding assembly 130.

In addition, the electronic device 100 further includes a protective member 150, which is disposed between the pusher 135 and the internal button 140. When the sliding assembly 130 moves from the closed position to the open position along the first direction D1 relative to the casing 110, the pusher 135 moves along the protective member 150 to reduce the probability that the pusher 135 directly rubs against the internal button 140 and damages the internal button 140 under long-term use. Certainly, in one embodiment, the protective member 150 may also be omitted.

Besides, the sliding assembly 130 of the embodiment further includes the sliding body 131 and a first magnetic member 133 located in the casing 110. The sliding body 131 and the toggle 132 are integrally formed. The exterior button 120 includes a second magnetic member 121. The first magnetic member 133 and the second magnetic member 121 face each other with two different magnetic poles.

When the sliding assembly 130 is in the closed position relative to the casing 110, the first magnetic member 133 is positioned opposite the second magnetic member 121, and the first magnetic member 133 is magnetically attracted to the second magnetic member 121, so that the exterior button 120 is retracted within the casing 110. Such a design prevents the exterior button 120 from protruding beyond the outer surface 111 of the casing 110 at will, thereby causing damage to the exterior button 120.

Therefore, when the sliding assembly 130 is in a closed position relative to the casing 110, the first side 125 and the second side 126 of the exterior button 1201 are flush with or retracted from the outer surface 111 of the casing 110.

The user can move the toggle 132 (FIG. 1) to extend the exterior button 120 from the opening 112 and protrude from the outer surface 111. The following introduces the relevant structure and operation method of the toggle 132 to drive the exterior button 120 to move.

Figure 3:
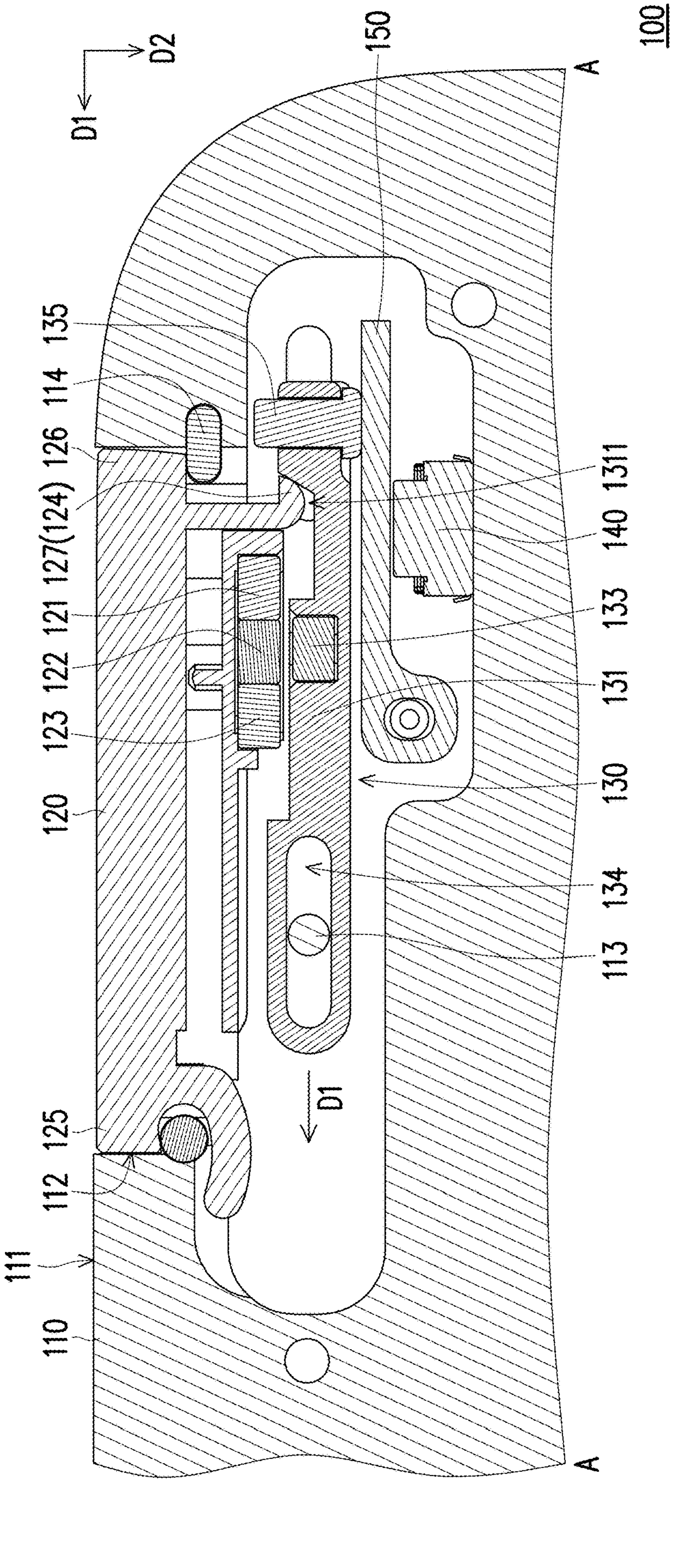
FIG. 3 to FIG. 5 are schematic cross-sectional views of a sliding assembly of the electronic device of FIG. 1 moving from the closed position to the open position.
Figure 4:
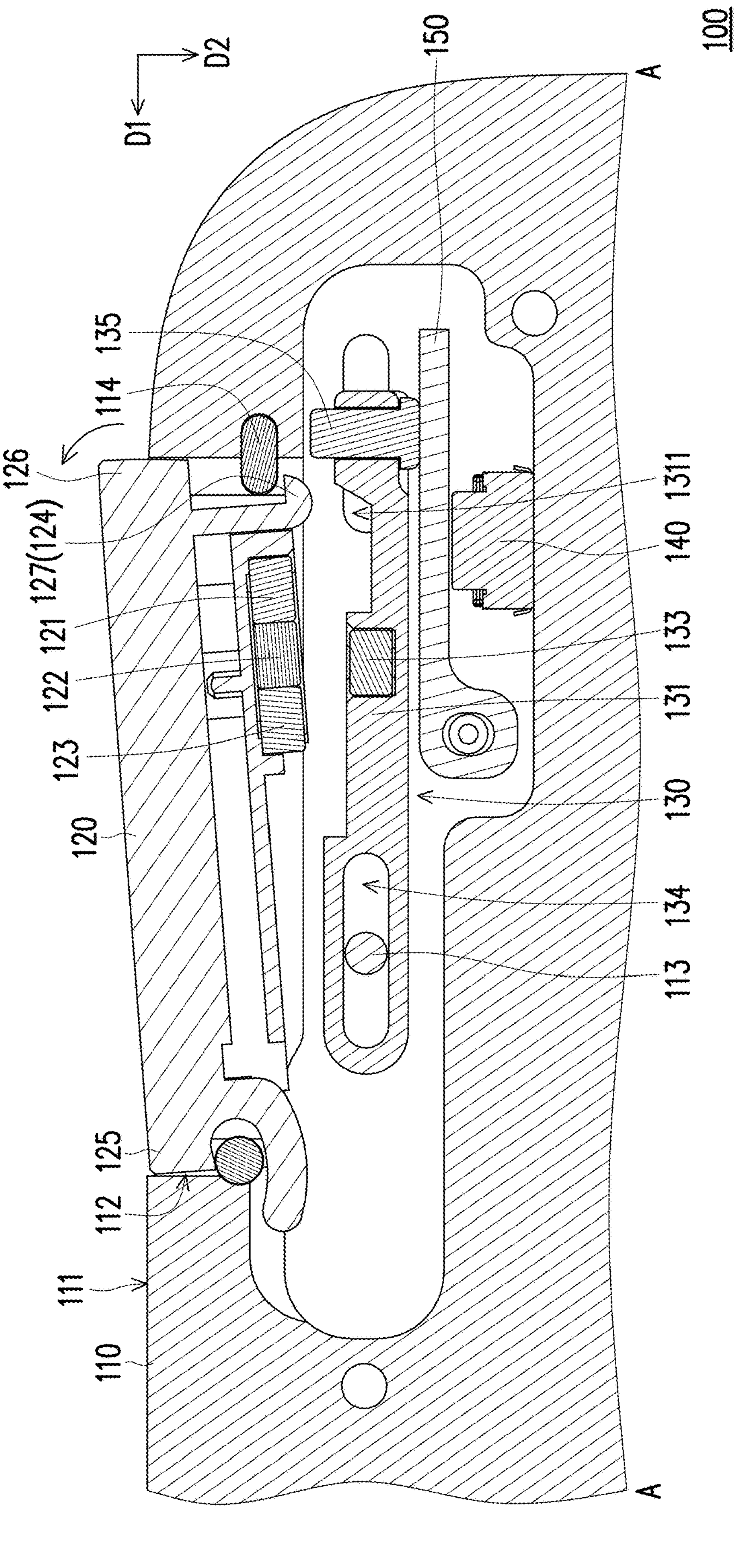
Figure 5:
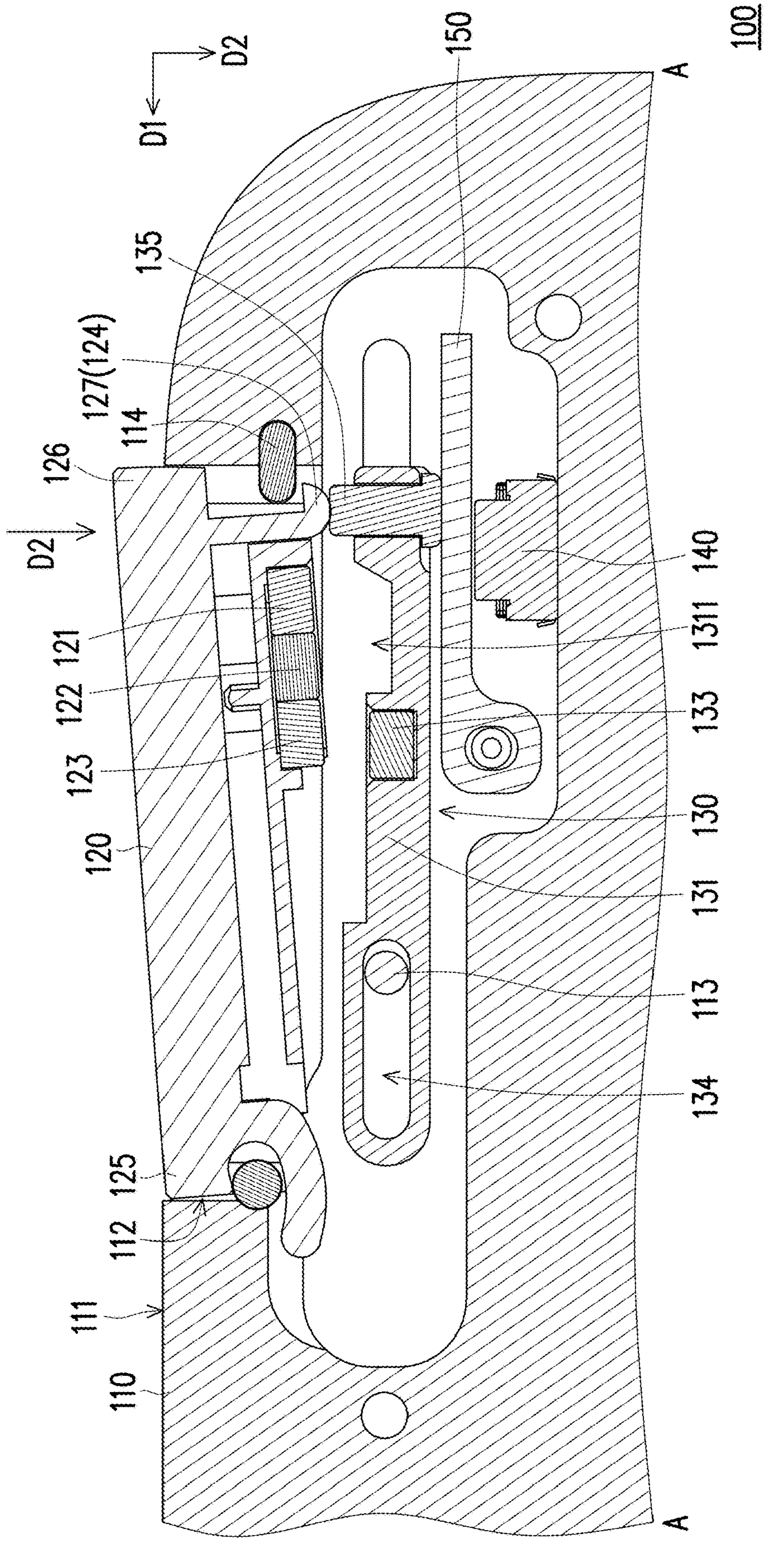

FIG. 3 to FIG. 5 are schematic cross-sectional views of a sliding assembly of the electronic device of FIG. 1 moving from the closed position to the open position.

Referring to FIG. 3 first, the exterior button 120 of the embodiment further includes a third magnetic member 122. The first magnetic member 133 and the third magnetic member 122 face each other with the same two magnetic poles.

When the toggle 132 is toggled and moves along the first direction D1, the sliding assembly 130 moves to an intermediate position relative to the casing 110. At this time, the first magnetic member 133 is located opposite the third magnetic member 122. As shown in FIG. 4, the third magnetic member 122 is repelled by the first magnetic member 133, so that the exterior button 120 rotates with the first side 125 as the axis of rotation, so that the second side 126 protrudes from the opening 112 and protrudes beyond the casing 110.

Referring to FIG. 5, the exterior button 120 further includes a fourth magnetic member 123. When the sliding assembly 130 moves to an open position relative to the casing 110, the first magnetic member 133 is magnetically attracted to the fourth magnetic member 123. The intermediate position (FIG. 3 and FIG. 4) is located between the closed position (FIG. 2A) and the open position (FIG. 5).

At this time, since the first magnetic member 133 is magnetically attracted to the fourth magnetic member 123, and the first magnetic member 133 magnetically repels the third magnetic member 122 at the same time, the sliding assembly 130 is not easy to slide relative to the casing 110 along the first direction D1. The user needs to exert greater effort to move the toggle 132 along the first direction D1. Such a design can prevent the user from accidentally touching the toggle 132 and causing the exterior button 120 to retract within the casing 110.

In addition, the sliding body 131 of the embodiment includes a groove 1311. The exterior button 120 includes a protruding foot 124. As shown in FIG. 2A, when the sliding assembly 130 is in the closed position relative to the casing 110, the protruding foot 124 is located within the groove 1311. As shown in FIG. 5, when the sliding assembly 130 is in the open position relative to the casing 110, the pusher 135 resists the protruding foot 124, so that the second side 126 of the exterior button 120 continues to protrude from the outer surface 111 of the casing 110 when not pressed. In this state, the first side 125 of the exterior button 120 is lower than or flush with the outer surface 111.

Besides, the casing 110 includes a stopper 114, which protrudes from an inner wall (the wall on the right side of the opening 112 in FIG. 5) surrounding the opening 112 and adjacent to the second side 126 of the exterior button 120. The exterior button 120 includes an inner hook 127 adjacent the second side 126 and formed on the protruding foot 124. As shown in FIG. 2A, when the second side 126 of the exterior button 120 is retracted within the outer surface 111 of the casing 110, the second side 126 rests on the stopper 114. As shown in FIG. 5, when the second side 126 of the exterior button 1201 protrudes from the outer surface 111, the stopper 114 is located next to the inner hook 127 to limit the second side 126 of the exterior button 120 from breaking away from the casing 110.

Therefore, as shown in FIG. 5, the second side 126 of the exterior button 120 is adapted to be pressed along the second direction D2 to drive the sliding body 131 to move along the second direction D2 to trigger the internal button 140. The electronic device 100 of the application sets the external button 120 of the entity to trigger the internal button 140, so that the user can have a better sense of feedback of the game experience when playing.

The user toggles the toggle 132 so that the sliding assembly 130 can make the exterior button 120 protrude from the casing 110 only through magnetic force, thereby helping to reduce the friction force when the second side 126 of the exterior button 120 protrudes or retracts within the casing 110. This makes the lifting process of the second side 126 of the exterior button 120 smoother. In addition, the application does not require other springs or electro-mechanical structures, that is, through the combination of the protruding foot 124, the groove 1311 and the pusher 135 with the first magnetic member 133, the second magnetic member 121, the third magnetic member 122, and the fourth magnetic member 123, which makes the second side 126 of the exterior button 120 protrude or retract from the inside of the casing 110. Such a design can save the space of the electronic device 100, allow other components to be installed inside the electronic device 100, or reduce the size of the electronic device 100, while reducing the manufacturing cost of the electronic device 100.

When the user wants to reset the second side 126 of the exterior button 120 to the casing 110, the user only needs to toggle the toggle 132 in the opposite direction of the first direction D1 to move the sliding assembly 130 from the open position (FIG. 5) to the closed position (FIG. 2A) relative to the casing 110. At this time, the first magnetic member 133 of the exterior button 120 will be attracted by the last magnetic member (i.e., the second magnetic member 121), causing the second side 126 of the exterior button 120 to be retracted into the casing 110.

It should be added that, although the first magnetic member 133, the second magnetic member 121, the third magnetic member 122 and the fourth magnetic member 123 of the embodiment are each shown as a single block, however, the application does not limit the number or volume of the first magnetic member 133, the second magnetic member 121, the third magnetic member 122 and the fourth magnetic member 123.

In summary, the first side of the exterior button of the electronic device of the application is pivotally connected to the casing, so that the exterior button is rotatably disposed on the casing. The sliding assembly is located between the exterior button and the internal button. The toggle of the sliding assembly is fixed to the sliding body and exposed to the casing. The pusher is linked to the sliding body in the first direction, and is movably arranged on the sliding body in the second direction. When the sliding assembly is in the closed position relative to the casing, the second side of the exterior button is retracted within the casing. When the sliding assembly moves along the first direction relative to the casing from the closed position to the open position, the second side of the exterior button protrudes from the opening and protrudes beyond the outer surface. The exterior button is suitable for being pressed to drive the pusher to move along the second direction to trigger the internal button, thereby allowing the user to press the physical exterior button to trigger the internal button, and providing a better gaming experience feedback. Besides, the electronic device of the application uses magnetic force to drive the exterior button outward and protrude from the outer surface, which not only reduces friction and makes the lifting process of the exterior button smoother, but also reduces manufacturing costs and saves space.

What is claimed is:

1. An electronic device, comprising:

a casing, having an outer surface and an opening at the outer surface;

an exterior button, having a first side and a second side opposite to each other, wherein the first side is pivotally connected to the casing so that the exterior button is rotatably disposed at the casing;

a sliding assembly, movably disposed on the casing, and includes a sliding body, a toggle and a pusher, the sliding body is located in the casing, the toggle is fixed to the sliding body and exposed to the casing, and the pusher is linked with the sliding body in a first direction, and is movably disposed at the sliding body in a second direction; and an internal button, located in the casing, wherein the sliding assembly is located between the exterior button and the internal button, when the sliding assembly is in a closed position relative to the casing, the second side of the exterior button is retracted within the casing, when the sliding assembly moves from the closed position to an open position along the first direction relative to the casing, the second side of the exterior button protrudes from the opening and protrudes beyond the outer surface, the exterior button is adapted to be pressed, driving the pusher to move along the second direction to trigger the internal button.

2. The electronic device according to claim 1, further comprises a protective member, disposed between the pusher and the internal button, when the sliding assembly moves from the closed position to the open position along the first direction relative to the casing, the pusher moves along the protective member.

3. The electronic device according to claim 1, wherein the exterior button comprises a protruding foot, when the sliding assembly is in the open position relative to the casing, the pusher presses against the protruding foot so that the exterior button continues to protrude beyond the casing when not pressed.

4. The electronic device according to claim 1, wherein the casing comprises a stopper protruding from an inner wall surrounding the opening and adjacent to the second side of the exterior button, the exterior button comprises an inner hook near the second side, when the second side of the exterior button is retracted within the casing, the second side rests on the stopper, when the second side of the exterior button protrudes beyond the outer surface, the stopper is located next to the inner hook to limit the exterior button from breaking away from the casing.

5. The electronic device according to claim 4, wherein the exterior button comprises a protruding foot, and the inner hook is formed on the protruding foot.

6. The electronic device according to claim 1, wherein the sliding body comprises a groove, the exterior button comprises a protruding foot, when the sliding assembly is in the closed position relative to the casing, the protruding foot is located in the groove.

7. The electronic device according to claim 1, wherein one of the casing and the sliding body comprises a first track extending along the first direction, and the other comprises a first guide pillar extending into the first track.

8. The electronic device according to claim 7, wherein the casing or the sliding body having the first track further comprises a second guide pillar, and the other comprises a second track along the first direction, the second guide pillar extends into the second track.

9. The electronic device according to claim 1, wherein when the sliding assembly is in the open position, the first side of the exterior button is lower than or flush with the outer surface.

10. The electronic device according to claim 1, wherein the sliding assembly comprises a first magnetic member, the exterior button comprises a second magnetic member, when the sliding assembly is in the closed position relative to the casing, the first magnetic member is magnetically attracted to the second magnetic member so that the second side of the exterior button is retracted within the casing.

11. The electronic device according to claim 10, wherein the exterior button comprises a third magnetic member, when the sliding assembly moves to an intermediate position relative to the casing, the third magnetic member is repelled by the second magnetic member so that the second side of the exterior button protrudes from the opening and protrudes beyond the outer surface, the intermediate position is located between the closed position and the open position.

12. The electronic device according to claim 11, wherein the exterior button comprises a fourth magnetic member, when the sliding assembly is in the open position relative to the casing, the first magnetic member is magnetically attracted to the fourth magnetic member.

* * * * *